US009542998B1

(12) United States Patent  
Akhilesh et al.

(10) Patent No.: US 9,542,998 B1  
(45) Date of Patent: Jan. 10, 2017

(54) WRITE ASSIST CIRCUIT INTEGRATED WITH LEAKAGE REDUCTION CIRCUIT OF A STATIC RANDOM ACCESS MEMORY FOR INCREASING THE LOW VOLTAGE SUPPLY DURING WRITE OPERATIONS

(71) Applicant: Synopsys, Inc., Mountain View, CA (US)

(72) Inventors: Ashish Akhilesh, Saratoga, CA (US); Yogesh Malviya, Sunnyvale, CA (US); Prakash Ravikumar Bhatia, Fremont, CA (US)

(73) Assignee: Synopsys, Inc, Mountain View, CA (US)

( * ) Notice: Subject to any disclaimer, the term of this patent is extended or adjusted under 35 U.S.C. 154(b) by 0 days.

(21) Appl. No.: 14/930,228

(22) Filed: Nov. 2, 2015

(51) Int. Cl.  
*G11C 11/419* (2006.01)  
*G11C 7/04* (2006.01)

(52) U.S. Cl.  
CPC .............. *G11C 11/419* (2013.01); *G11C 7/04* (2013.01)

(58) Field of Classification Search  
CPC ........... G11C 7/04; G11C 11/419; G11C 7/12; G11C 5/145  
See application file for complete search history.

(56) References Cited

U.S. PATENT DOCUMENTS

| 8,164,964 | B2 | 4/2012 | Chandra et al. |
| 8,861,290 | B2 | 10/2014 | Zimmer et al. |
| 9,236,116 | B1* | 1/2016 | Braceras ............... G11C 11/419 |
| 2012/0170391 | A1* | 7/2012 | Janardan .................. G11C 7/04 365/194 |
| 2012/0230122 | A1 | 9/2012 | Chandra et al. |

OTHER PUBLICATIONS

Chandra, V. et al., "Write Assist in Low-Voltage SRAMs," White Paper, ARM, May 2012, 8 pages.  
Nguyen, Q.T., "Read/Write Assist Circuits and SRAM Design," Master Thesis, The University of Texas at Austin, Dec. 2009, 59 pages.

* cited by examiner

Primary Examiner — Richard Elms  
Assistant Examiner — Ajay Ojha  
(74) Attorney, Agent, or Firm — Fenwick & West LLP (57) ABSTRACT

A transient voltage collapse circuit provides a reference voltage for an SRAM (static random access memory). The SRAM receives a first reference voltage and a second reference voltage higher than the first reference voltage. The transient voltage collapse circuit provides the first reference voltage to the SRAM via a voltage supply line. The transient voltage collapse circuit maintains the voltage supply line at a first voltage level during a power save mode of the SRAM. The transient voltage collapse circuit increases the voltage of the voltage supply line during a write operation of the SRAM. The increase in the voltage of the supply line reduces the gap between first reference voltage and the second reference voltage, thereby assisting with the write operation of the SRAM.

20 Claims, 9 Drawing Sheets

WRITE ASSIST CIRCUIT INTEGRATED WITH LEAKAGE REDUCTION CIRCUIT OF A STATIC RANDOM ACCESS MEMORY FOR INCREASING THE LOW VOLTAGE SUPPLY DURING WRITE OPERATIONS

BACKGROUND

1. Field of the Disclosure

The present disclosure relates to static random access memory (SRAM) circuits in general and in particular to low power write assist techniques for SRAM circuits.

2. Description of the Related Art

Static random access memory (SRAM) is often included in very large scale integration VLSI system-on-chip (SoC) applications. The size of the SRAM circuit has a significant impact on the overall size of an integrated circuit for such applications. Therefore, there is a need to keep the size of SRAM circuits small. Furthermore, there is a trend towards reducing operation supply voltage of these integrated circuits. Reliability of the SRAM circuits reduces as supply voltages are reduced due to variations in circuit characteristics such as threshold voltages of transistors. Write assist schemes are used for improving the reliability of writes to SRAM circuits used for low power applications. These write assist schemes often result in increase in dynamic power consumption of the SRAM circuits and also increase area of the circuit.

SUMMARY

Embodiments relate to circuits for operating an SRAM. The circuit comprises a bias transistor and a write assist circuit. The bias transistor has a first terminal, a second terminal, and an input terminal. The first terminal of the bias transistor is connected to a voltage supply line of SRAM cells. The second terminal of the bias transistor is connected to a first reference voltage. The input terminal of the bias transistor receives a first input voltage that turns the bias transistor on to maintain the voltage supply line at a first voltage level. The input terminal of the bias transistor also receives a power save signal during a power save operation of the SRAM cells. The power save signal turns the bias transistor on to maintain the voltage supply line at a second voltage level higher than the first voltage level during a power save mode of a device using the SRAM. Maintaining the voltage supply at the second voltage level reduces leakage through the supply line during the power save mode. The input terminal of the bias transistor receives a write assist pulse during a write operation of the SRAM cells. The write assist pulse causes the bias transistor to turn off, thereby disconnecting the voltage supply line from the first reference voltage. The write assist circuit has an input terminal connected to the input terminal of the bias transistor and an output terminal connected to the voltage supply line. The input terminal of the write assist circuit receives the write assist pulse. Responsive to the write assist pulse, the write assist circuit increases the voltage of the voltage supply line to a third voltage level higher than the first voltage level. Increasing the voltage of the voltage supply line to the third voltage level during a write operations assists the SRAM with the write operation. The reuse of the bias transistor for power save mode and for the write assist operation provides savings in the area of the write assist circuit.

In an embodiment, the write assist circuit comprises a capacitive device and an access transistor. The capacitive device has a first terminal and a second terminal. The first terminal of the capacitive device is connected to the first reference voltage. The access transistor has a first terminal connected to the voltage supply line, a second terminal connected to the second terminal of the capacitive device, and an input terminal. The input terminal of the access transistor receives the write assist pulse causing the access transistor to be turned on, thereby causing the charge stored in the capacitive device to increase the voltage of the voltage supply line to the second voltage level.

In an embodiment, the write assist circuit comprises an inverter having an input terminal and an output terminal. The input terminal of the inverter is connected to the input terminal of the bias transistor to receive the write assist pulse. The write assist pulse received at the input of the inverter causes the inverter to generate an inverted write assist pulse at the output terminal. The write assist circuit further has a precharger transistor comprising a first terminal, a second terminal and an input terminal. The input terminal of the precharger transistor is connected to the output terminal of the inverter to receive the inverted write assist pulse. The first terminal of the precharger transistor is connected to the second reference voltage. The second terminal of the precharger transistor is connected to the second terminal of the capacitive device to charge the capacitive device when the inverted write assist pulse is inactive. The precharger transistor stops charging the capacitive device responsive to receiving the inverted write assist pulse at the input terminal.

In an embodiment, the write assist circuit includes a pull-up transistor having a first terminal, a second terminal, and an input terminal. The first terminal of the pull-up transistor is connected to the voltage supply line. The second terminal of the pull-up transistor is connected to the second reference voltage. The input terminal of the pull-up transistor receives a short write assist pulse during the write operation of the SRAM cells. The short write assist pulse is shorter in duration compared to the write assist pulse. The short write assist pulse causes the pull-up transistor to increase the rate at which voltage of the voltage supply line of the SRAM cells increases responsive to the write assist pulse. This embodiment allows faster timing of the write operation and also allows for smaller area of the write assist circuit. Specifically, use of the short write assist pulse allows smaller capacitive device to be used.

In an embodiment, a plurality of SRAM cells receives a word line enable signal having an edge. The edge of the word line enable signal cause the plurality of SRAM cells to be enabled for the write operation. The write assist pulse is received responsive to the edge of the word line enable signal.

In an embodiment, the second voltage level to which the write assist circuit increases the voltage of the voltage supply line is lower than the second reference voltage.

In an embodiment, the write assist pulse is active for a duration shorter than a duration of the power save signal.

BRIEF DESCRIPTION OF THE DRAWINGS

The teachings of the embodiments can be readily understood by considering the following detailed description in conjunction with the accompanying drawings.

DETAILED DESCRIPTION

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1:
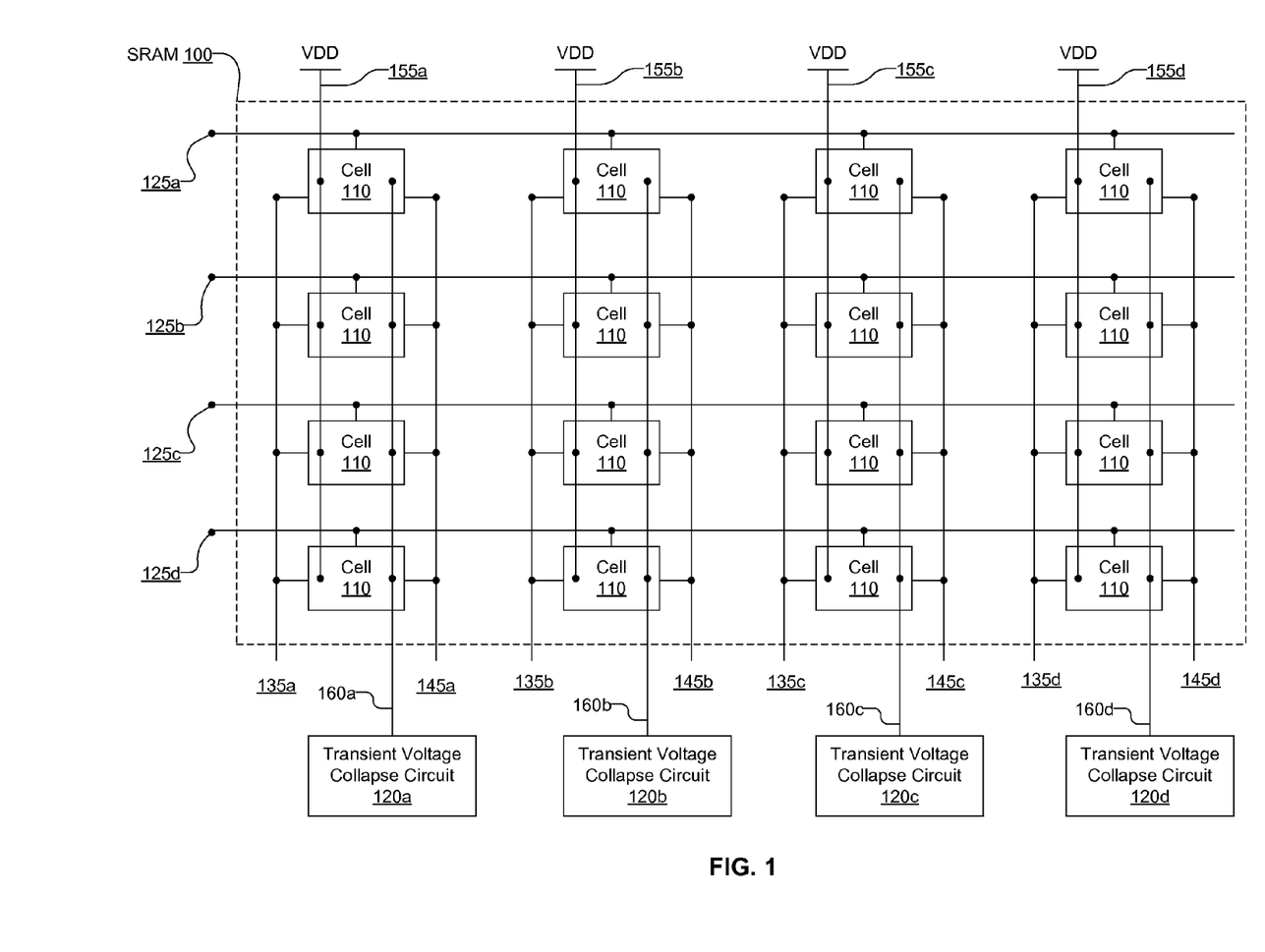
FIG. 1 is a schematic block diagram shows an SRAM circuit receiving voltage supply from a transient voltage collapse circuit, according to an embodiment.

FIG. 1 shows an SRAM circuit receiving voltage supply from a transient voltage collapse circuit, according to an embodiment. A letter after a reference numeral, such as "125a," indicates that the text refers specifically to the element having that particular reference numeral. A reference numeral in the text without a following letter, such as "125," refers to any or all of the elements in the figures bearing that reference numeral (e.g. "125" in the text refers to reference numerals "125a" and/or "125b" in the figures).

FIG. 1 shows an SRAM 100 comprising a plurality of cells 110. The cells 110 are arranged as rows and columns, such that each row of cells 110 corresponds to a word. The rows and columns shown in FIG. 1 represent a logical organization of the cells and may not correspond to a physical layout of the cells, for example, on an integrated circuit. Each row of the cells 110 representing a word is connected to a word line 125. The word line 125 provides a word line enable signal WL that enables a specific word line of the SRAM 100. The word line signals WL are generated by a control logic of SRAM 100 (not shown in FIG. 1).

Each cell 110 is connected to a first reference voltage provided by a transient voltage collapse circuit 120 via a voltage supply line 160. Each cell is also connected to a second reference voltage VDD via a voltage supply line 155. The second reference voltage VDD is higher than the first reference voltage. Each cell is connected to bit lines 135 and 145 that provide input data to be written in the cell. The data provided at the bit line 135 is complement of the data provided at the bit line 145.

Although, FIG. 1 shows a transient voltage collapse circuit 120 corresponding to each column of cells 110, in other embodiments, the same transient voltage circuit 120 may be shared by multiple columns of cells. In an embodiments, the columns of the SRAM are divided into subsets of columns. A transient voltage collapse circuit supplies voltage to each subset of the columns. Accordingly, the number of transient voltage collapse circuits matches the number of subsets of columns.

The transient voltage collapse circuit 120 maintains the first reference voltage at a first voltage value V1 that is lower than the second reference voltage VDD when no write operations are performed by SRAM 100. The transient voltage collapse circuit 120 increases the voltage of the first reference voltage during a write operation of the SRAM 100 to a third voltage value V3 that is higher than the first voltage value V1 but lower than the second reference voltage VDD. The increase in the voltage of the first reference voltage causes decrease in the gap between the first reference voltage V1 and the second reference voltage VDD, thereby enhancing a writing operation of cells 110 according to the data provided as input to the cells via bit lines 135 and 145.

Figure 2:
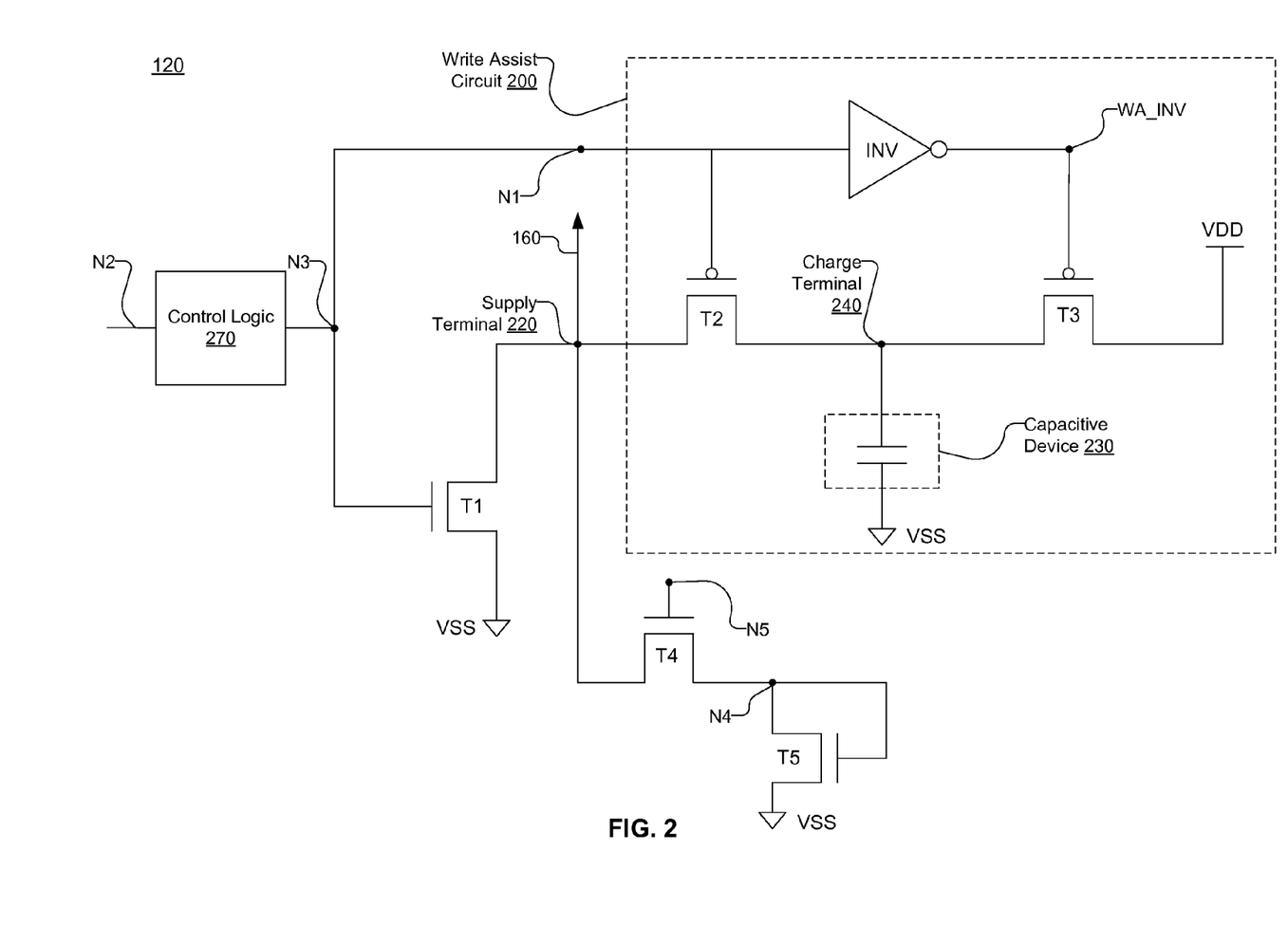
FIG. 2 is a circuit diagram illustrating the transient voltage collapse circuit, according to an embodiment.

FIG. 2 is a circuit diagram illustrating the transient voltage collapse circuit, according to an embodiment. The transient voltage collapse circuit 120 comprises a bias transistor T1, a control logic 270, a write assist circuit 200, and footer transistors T4 and T5. The transient voltage collapse circuit 120 generates voltage at the supply terminal 220 and provides the generated voltage to the voltage supply line 160 of the SRAM cells 110. The circuit shown in FIG. 2 receives voltage from the second reference voltage VDD and a third reference voltage VSS. The voltage of the second reference voltage VDD is higher than the voltage of the third reference voltage VSS.

Figure 3:
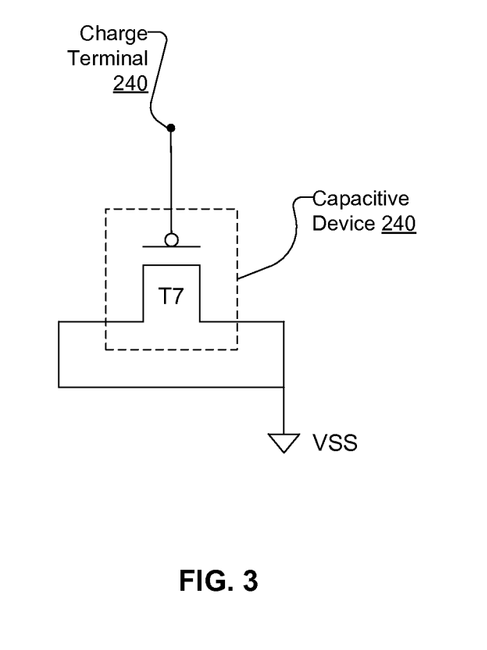
FIG. 3 is a circuit diagram illustrating a capacitive device based on a transistor for use in the circuit shown in FIG. 2, according to an embodiment.
Figure 7:
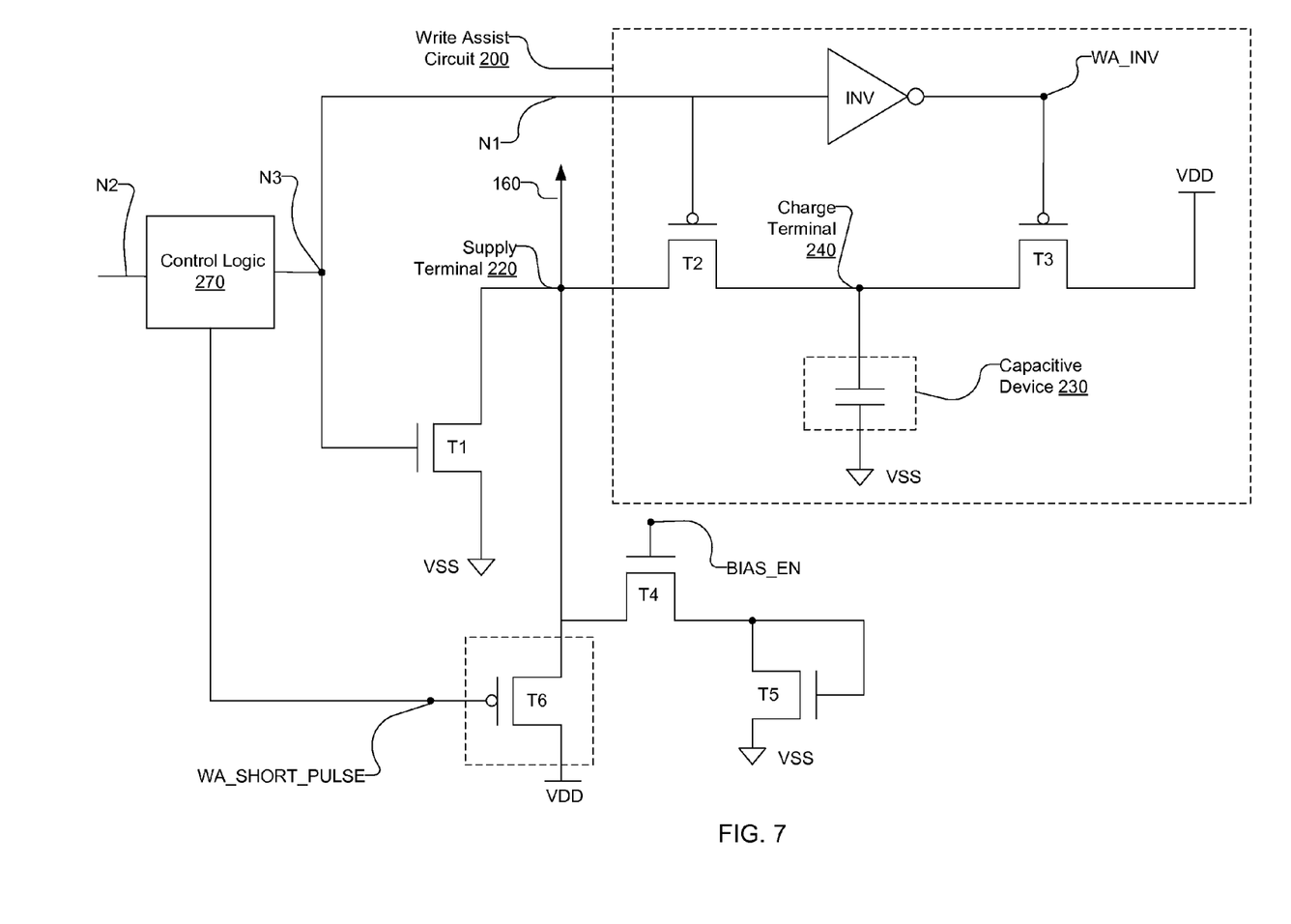
FIG. 7 is a circuit diagram illustrating a transient voltage collapse circuit using a short pulse, according to an embodiment.

Each transistor shown in FIG. 2 (and FIGS. 3 and 7 described below) has an input terminal, a first terminal, and a second terminal. The transistors used in the circuit shown in FIG. 2 are MOSFETs (metal oxide semiconductor field effect transistor). In some embodiments, the transistors used in the circuits shown in FIGS. 2, 3, and 7 are FinFETs (fin field effect transistor.) Other embodiments can use other types of transistors, for example, BJTs (bipolar junction transistors.) The input terminal of a MOSFET is the gate of the transistor. If a transistor is PMOSFET (p-channel metal oxide semiconductor field effect transistor), the first terminal is the source of the PMOSFET, and the second terminal is the drain of the PMOSFET. If a transistor is NMOSFET (n-channel metal oxide semiconductor field effect transistor), the first terminal is the drain of the NMOSFET, and the second terminal is the source of the NMOSFET.

Figure 4:
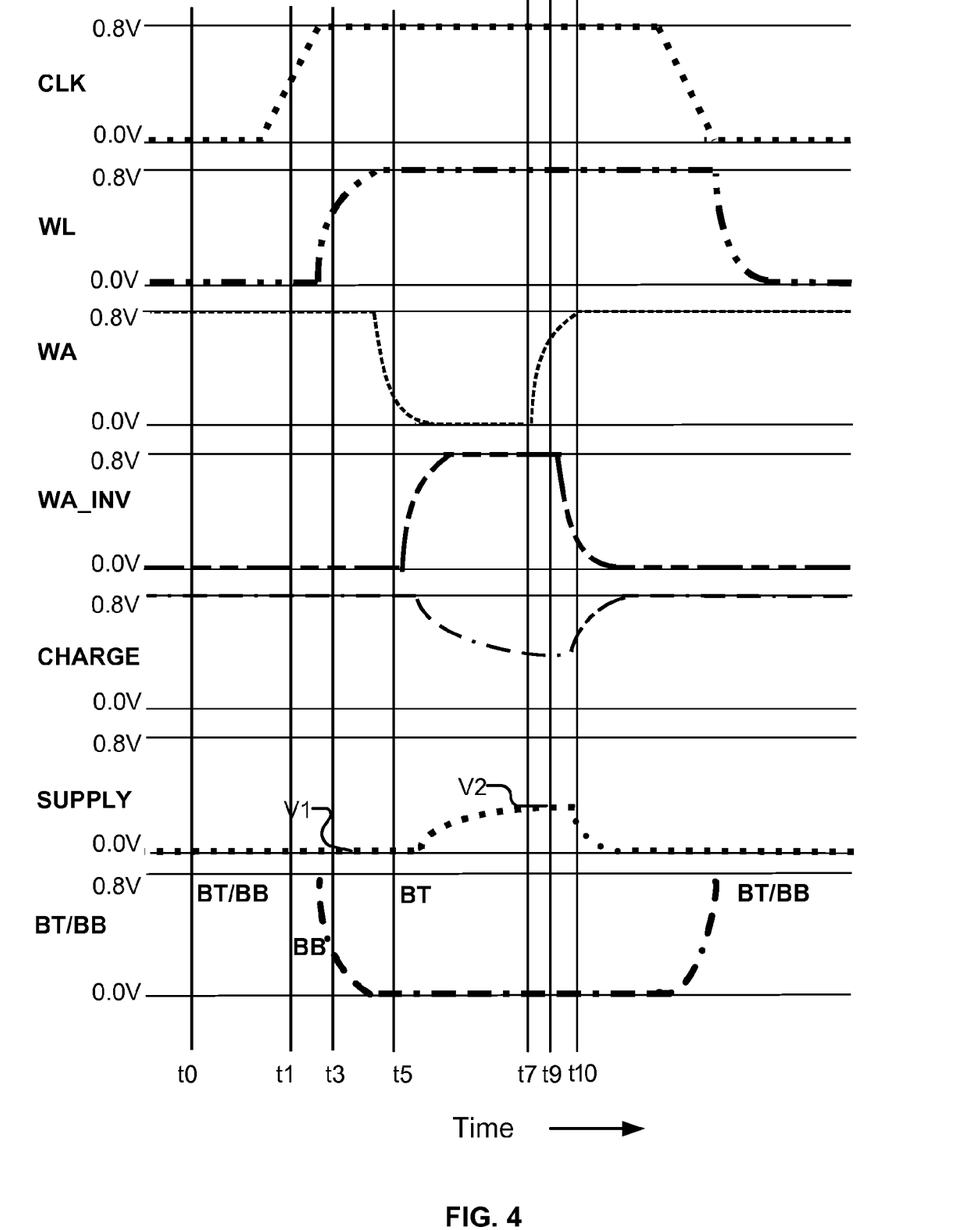
FIG. 4 is a timing diagram illustrating the signals at various nodes of the circuit of FIG. 2, according to an embodiment.

The control logic 270 has an input terminal N2 and an output terminal N3. The control logic 270 receives the clock signal CLK at the input terminal N2 and generates a write assist pulse WA at the output terminal N3 during a write operation of SRAM 100. The control logic 270 generates the write assist pulse WA when the word enable signal at word line 125 enables a word line for performing a write to the enabled cells 110. The details of the timings of the various signals of the circuit of FIG. 2 are shown in FIG. 4.

The output of the control logic 270 is connected to the input of the bias transistor T1 for providing the write assist signal WA to the bias transistor T1. The first terminal of the bias transistor T1 is connected to the supply terminal 220. The second terminal of the bias transistor T1 is connected to the voltage supply VSS.

When there is no write operation being performed by SRAM 100, the write assist signal WA has a high value causing the bias transistor T1 to conduct. As a result, the supply terminal 220 is connected to the voltage supply VSS via the bias transistor T1 and has a first voltage value V1. The supply terminal 220 provides the first voltage value V1 to the supply line 165.

The bias transistor T1 is also used during a power save operation. During the power save operation, the input terminal of the bias transistor receives a power save signal that causes the voltage level of the first terminal of the bias transistor to increase to a second voltage level V2 such that V2 is higher than V1. Accordingly, the transient voltage collapse circuit 120 reuses at least a transistor from a core bias portion of the circuit used for generating a bias signal during a power save mode. The core bias portion of the circuit is configured to reduce the leakage path from the high voltage supply to the low voltage supply of the SRAM. The reuse of the bias transistor T1 allows implementing the transient voltage collapse circuit using small area in an integrated circuit chip. As a result, the disclosed transient voltage collapse circuit 120 provides a low power and low area circuit for performing write assist in an SRAM.

When the write assist pulse is received by the input terminal of the bias transistor T1 and the write assist signal WA switches from a high value to a low value. As a result, the bias transistor T1 stops conducting, thereby disconnecting the supply terminal 220 from the voltage supply VSS. As a result, during the period that the write assist pulse causes the write assist signal WA to have a low value, the voltage of the supply terminal 220 increases to a third voltage value V3 higher than V1 as further described below.

The footer transistors T4 and T5 along with bias transistor T1 maintain a bias voltage level at the supply terminal 220. The input terminal of transistor T4 is connected to node N5 and receives a bias enable signal generated by the control logic 270. The first terminal of the transistor T4 is connected to the supply terminal 220 and the second terminal of the transistor T4 is connected to node N4. The first terminal of transistor T5 and the input terminal of transistor T5 are both connected to node N4. The second terminal of transistor T5 is connected to the third voltage reference VSS. The bias enable signal causes transistor T4 to conduct via transistor T5, thereby maintaining the voltage level of the supply terminal at the first voltage level V1.

The write assist circuit 200 has an input terminal connected to node N1 and an output terminal connected to the supply terminal 220. The write assist circuit 200 includes an inverter INV, an access transistor T2, a precharger transistor T3, and a capacitive device 230. According to the embodiment shown in FIG. 2, transistors T2 and T3 are PMOSFETs and transistors T1, T4, and T5 are NMOSFETs. However, in other embodiments, these transistors can be of different types than those indicated in FIG. 2. For example, transistors T2 and T3 can be NMOSFETs and transistors T1, T4, and T5 can be PMOSFETs.

The capacitive device 230 is a device that stores charge. The capacitive device 230 can be a capacitor or a transistor as shown in FIG. 3 described below. The capacitive device 230 has a first terminal connected to the charge terminal 240 and a second terminal connected to the voltage supply VSS. The capacitive device 230 gets charged when the precharger transistor T3 is conducting. The capacitive device 230 stores the charge and discharges the charge through access transistor T2 when the access transistor T2 is conducting.

The input terminal of the access transistor T2 is connected to note N2 and receives the write assist signal WA generated by the control logic 270. The first terminal of the access transistor T2 is connected to the charge terminal 240 of the capacitive device 230. The second terminal of the access transistor T2 is connected to the supply terminal 220. When the SRAM 100 is not performing a write operation, the high value of the write assist signal WA causes the access transistor T2 to stop conducting (i.e., turn off), thereby isolating the charge terminal 240 from the supply terminal 220. As a result, the voltage level of the supply terminal 220 is determined by the transistors T1, T4, and T5.

The inverter INV has an input terminal and an output terminal. The inverter INV inverts the input signal received at the input terminal and provides the inverted signal at the output terminal. The inverter INV receives the write assist pulse WA at the input of the inverter INV and generates an inverted write assist pulse WA_INV at the output. The inverted write assist pulse WA_INV is provided as input to the precharger transistor T3.

The inverted write assist pulse WA_INV generated by the inverter INV is provided as input to the input terminal of precharger transistor T3. The first terminal of the precharger transistor T3 is connected to the voltage supply VDD and the second terminal of precharger transistor T3 is connected to the capacitive device 230.

The charge terminal 240 of the capacitive device 230 is connected to the second terminal of the precharger transistor T3. If the SRAM 100 is not performing a write operation, the write assist signal WA has a high value and the inverted write assist signal WA_INV has a low value. The low value of the WA_INV signal causes the precharger transistor T3 to conduct, thereby connecting the charge terminal 240 of the capacitive device 240 with the voltage supply VDD and charging the capacitive device 230.

When the write assist signal WA has a low value during a write operation of SRAM 100, the WA_INV signal has a high value causing the precharger transistor T3 to stop conducting (i.e., turn off). Furthermore, since the write assist signal WA has a low value, the access transistor T2 starts conducting (i.e., turns on). As a result, the charge terminal 240 is connected to the supply terminal 220 via the access transistor T2. As a result, the charge of the charge terminal 240 causes the voltage of the supply terminal 220 to increase during the write assist pulse.

When the write assist signal WA goes back to high value at the end of the write assist pulse, the access transistor T2 stops conducting (i.e., turn off) and the supply terminal 220 is disconnected from the charge terminal 240. Furthermore, the high value of WA causes the access transistor T1 to start conducting (i.e., turn on), thereby connecting the supply terminal 220 to the voltage supply VSS. This causes the increased voltage of the supply terminal 220 to reduce back to the first voltage value V1 after the write assist pulse.

In an embodiment, the control logic 270 generates a power save signal under certain conditions, for example, when a device incorporating the SRAM 200 enters a power save mode. In this embodiment, the control logic 270 generates a second input voltage Vi2 that is higher than the first input voltage value Vi1. The second input voltage Vi2 is provided as input to the bias transistor T1 and causes the supply terminal 220 to increase to a voltage level V3 above the first voltage level V1. The increase in voltage level of the supply terminal 220 decreases any leakage current that flows from the voltage supply VDD via the supply terminal 220 in power save modes.

FIG. 3 is a circuit diagram illustrating a capacitive device embodied using a transistor, according to an embodiment. As shown in FIG. 3, the capacitive device comprises a transistor T7. The input terminal of transistor T7 is connected to the charge terminal 240. The first and second terminal of the transistor T7 are both connected to the voltage supply VSS.

FIG. 4 is a timing diagram illustrating the signals at various nodes of the circuit of FIG. 2, according to an embodiment. FIG. 4 shows the low value of signals as 0.0 V and the high value of signals as 0.8 V. In other embodiments, the low and high values can be different from those indicated in FIG. 4.

FIG. 4 shows the clock signal CLK, the word line enable signal WL received at 125, the write assist signal WA generated by the control logic 270, the inverted write assist signal WA_INV generated by the inverter INV, a CHARGE signal at the charge terminal 240, a SUPPLY signal at the supply terminal 220, and the inputs BT and BB received by the cells 110 at the bit lines 135 and 145 respectively. The horizontal axis corresponds to time.

At time t0, there is no write operation being performed by SRAM 100. Accordingly, at time t0, the WA_INV signal is low, causing the precharger transistor T3 to conduct and charge the capacitive device 230. Accordingly, the CHARGE signal is high since the capacitive device 230 is charged. Furthermore, the write assist signal WA is low, causing the access transistor T2 to disconnect the charge terminal 240 from the supply terminal 220.

The following scenario illustrates the signals when a write operation is performed by the SRAM 100. The clock signal CLK goes from a low value to a high value at time t1.

Responsive to the clock signal CLK going high, the control logic 270 generates the word enable signal WL at time t3 that occurs after t1. Furthermore, at time t3 the data signal BT/BB is received by the inputs of the cells 110. Accordingly, the value of BT/BB may change at time t3, depending on the previous value of BT/BB. FIG. 4 shows that signal BB changes value from high to low at time t3 whereas the signal BT stays high.

The control logic 270 also generates the write assist pulse causing the write assist signal WA to go from high to low at time t5 that occurs after t1 and t3. The inverter INV generates the inverted write assist signal WA_INV by inverting the write assist signal WA. Accordingly, the inverted write assist signal WA_INV goes from a low value to a high value when the write assist signal WA goes from a high to a low value. The high value of the inverted write assist signal WA_INV causes the precharger transistor T3 to stop charging the capacitive device 230 and the low value of WA causes the access transistor T2 to conduct, thereby connecting the charge terminal 240 with the supply terminal. Accordingly, the capacitive device 230 starts discharging via the supply terminal 240, causing the CHARGE signal to decrease below the high value at time t7. Furthermore, as the CHARGE signal decreases at time t7, the voltage of the supply terminal 240 increases as shown by the SUPPLY signal at t7.

At the end of the write assist pulse at time t9, the write assist signal WA reverts back from a low value to a high value. Accordingly, the inverted write assist signal WA_INV goes from high to low value at t10. The low value of inverted write assist signal WA_INV causes the precharge transistor T3 to start conducting at t10 and start charging the capacitive device 230. Furthermore, the high value of write assist signal WA causes the access transistor T2 to disconnect and the bias transistor T1 to start conducting, thereby causing the voltage of the supply terminal 220 to drop as shown by the SUPPLY signal at t10.

Figure 5:
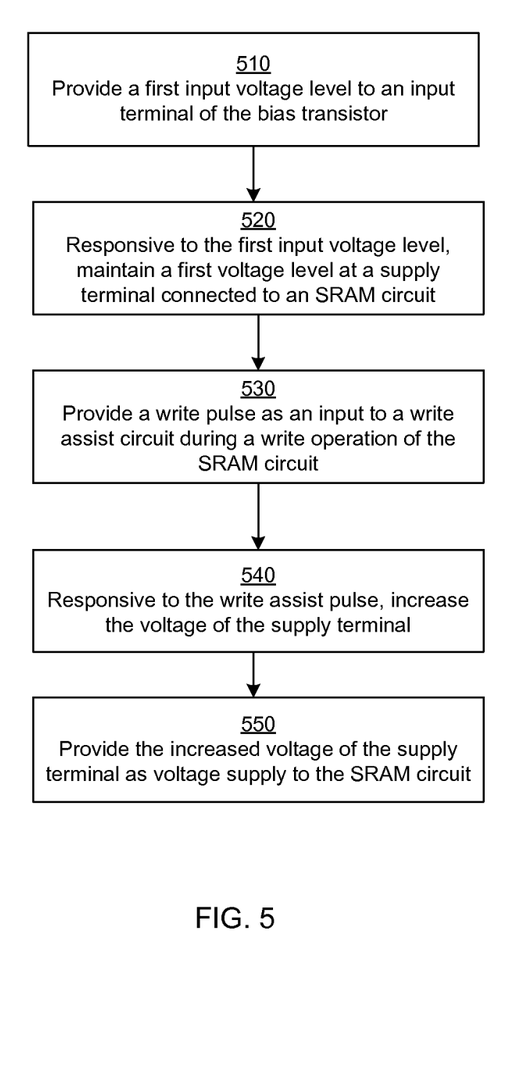
FIG. 5 is a flowchart illustrating the process of generating the voltage supply for the SRAM circuit, in accordance with an embodiment.

FIG. 5 is a flowchart illustrating the process of generating the voltage supply for the SRAM circuit, in accordance with an embodiment. The control logic 270 provides 510 a first input voltage level Vi1 to the input terminal of the bias transistor T1. The first input voltage level Vi1 is a high voltage level that causes the bias transistor T1 to conduct, thereby connecting the first terminal of the bias transistor T1 to the reference voltage VSS. The first input voltage level Vi1 at the input terminal of the bias transistor T1 maintains 520 the first terminal of the bias transistor T1 at the first voltage level V1. The first input voltage level at the input terminal of the bias transistor T1 causes the supply terminal 220 to be maintained at the first voltage level V1.

The control logic 270 provides 530 the write assist pulse as input to the write assist circuit 200 during a write operation of SRAM 100. The write assist pulse causes the input voltage of the bias transistor T1 to drop below the first input voltage level Vi1. The write assist pulse causes the input voltage of the bias transistor T1 to drop below the first input voltage level for a short duration compared to the time period that the control logic 270 keeps the input voltage of the bias transistor T1 at the first input voltage level.

The write assist circuit 200 increases 540 the voltage of the supply terminal 220 as a result of the write assist pulse. The supply terminal 220 provides 550 the increased voltage as a voltage supply to cells 110 of the SRAM 200. The increased voltage causes the gap between the voltage provided to SRAM 100 via supply lines 155 and 135 to decrease, thereby assisting with the write operation being performed.

Figure 6:
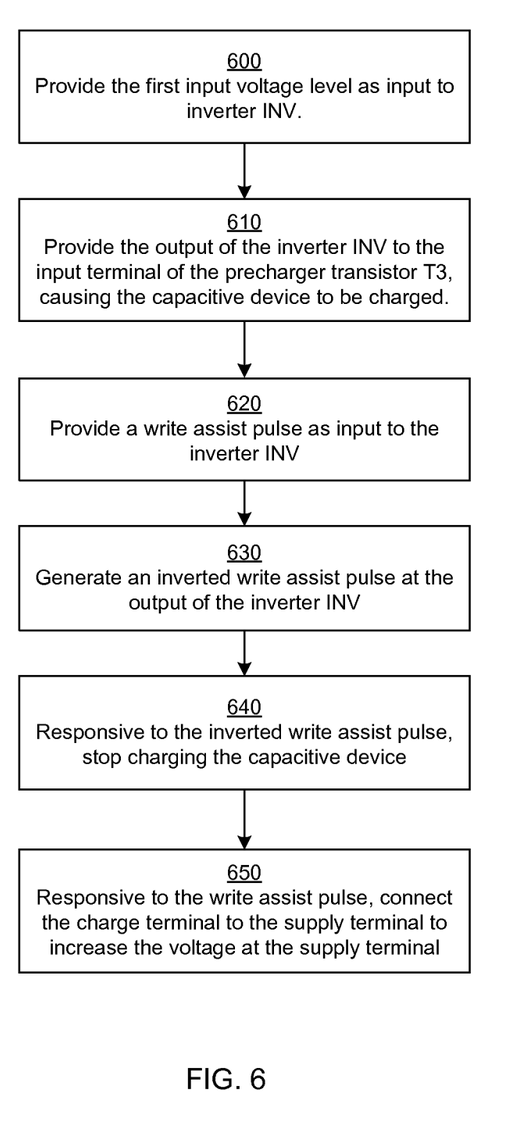
FIG. 6 is a flowchart illustrating the process of using a capacitive device to generate the voltage supply for the SRAM circuit, in accordance with an embodiment.

FIG. 6 is a flowchart illustrating the process of using a capacitive device to generate the voltage supply for the SRAM circuit, in accordance with an embodiment. FIG. 6 provides details of the signals through nodes of the write assist circuit 200. The control logic 270 provides 600 the first input voltage level Vi1 as input to the inverter INV. The first input voltage level Vi1 is also provided to the input terminal of the access transistor T2 and causes the access transistor T2 to stop conducting.

The output of the inverter INV is provided 610 to the input terminal of the precharger transistor T3. The output of the inverter INV generated responsive to receiving the first input voltage level at the input of the inverter INV causes the precharger transistor T3 to conduct, thereby causing the capacitive device 230 to get charged.

During a write operation of SRAM 100, the control logic 270 provides 620 the write assist pulse as input to the inverter INV. The inverter INV generates 630 an inverted write assist pulse at the output of the inverter INV. The inverter INV provides the inverted write assist pulse as input to the precharger transistor T3. Responsive to the inverted write assist pulse, the precharger transistor T3 stops 640 charging the capacitive device 230. Furthermore, the write assist pulse causes the access transistor T2 to conduct. Responsive to the write assist pulse WA, the access transistor T2 connects 650 the charge terminal 240 to the supply terminal 220, thereby causing the voltage of the supply terminal 220 to increase. This increased voltage is provided as voltage supply to the cells 110 of the SRAM 100 via the voltage supply line 160 during the write operation.

FIG. 7 is a circuit diagram illustrating the transient voltage collapse circuit using a short pulse generator, according to an embodiment. The circuit shown in FIG. 7 includes a transistor T6 in addition to the circuit components shown in FIG. 2. The input terminal of the transistor T6 is connected to an output of the control logic 270. The first terminal of transistor T6 is connected to the supply terminal 220. The second terminal of the transistor T6 is connected to the second reference voltage VDD. The remaining components shown in FIG. 7 correspond to the components of the circuit shown in FIG. 2.

The control logic 270 provides the first input voltage level to the transistor T6 causing the transistor T6 to conduct. As shown in FIG. 7, T6 is a PMOSFET. Since the first input voltage level is a high voltage value, the first input voltage level causes the transistor T6 to stop conducting.

The control logic 270 generates a short write assist pulse WA_SHORT_PULSE during a write operation of SRAM 100. In an embodiment, the timing of the short write assist pulse WA_SHORT_PULSE overlaps with the write assist pulse but is shorter in duration compared to the write assist pulse. The WA_SHORT_PULSE signal causes the voltage levels of the input terminal of transistor T6 to decrease below the first input voltage level, causing the transistor T6 to start conducting. As a result, during the write operation, the WA_SHORT_PULSE signal causes the supply terminal 220 to be connected to the second reference voltage VDD. This causes the voltage level of the supply terminal 220 to increase at a faster rate compared to the corresponding voltage levels of the circuit shown in FIG. 2. This causes the gap between the voltage supply lines 155 and 160 of SRAM 100 to decrease at a faster rate during the write operation, thereby causing the write operation to complete faster than a corresponding write operation of the circuit shown in FIG. 2. This embodiment allows faster timing of the write operation for the SRAM. Furthermore, this embodiment provides for smaller area of the write assist circuit. Specifically, smaller capacitive device can be used since the short write pulse causes the voltage level of the supply terminal to increase, thereby compensating for a smaller size of the capacitive device.

Figure 8:
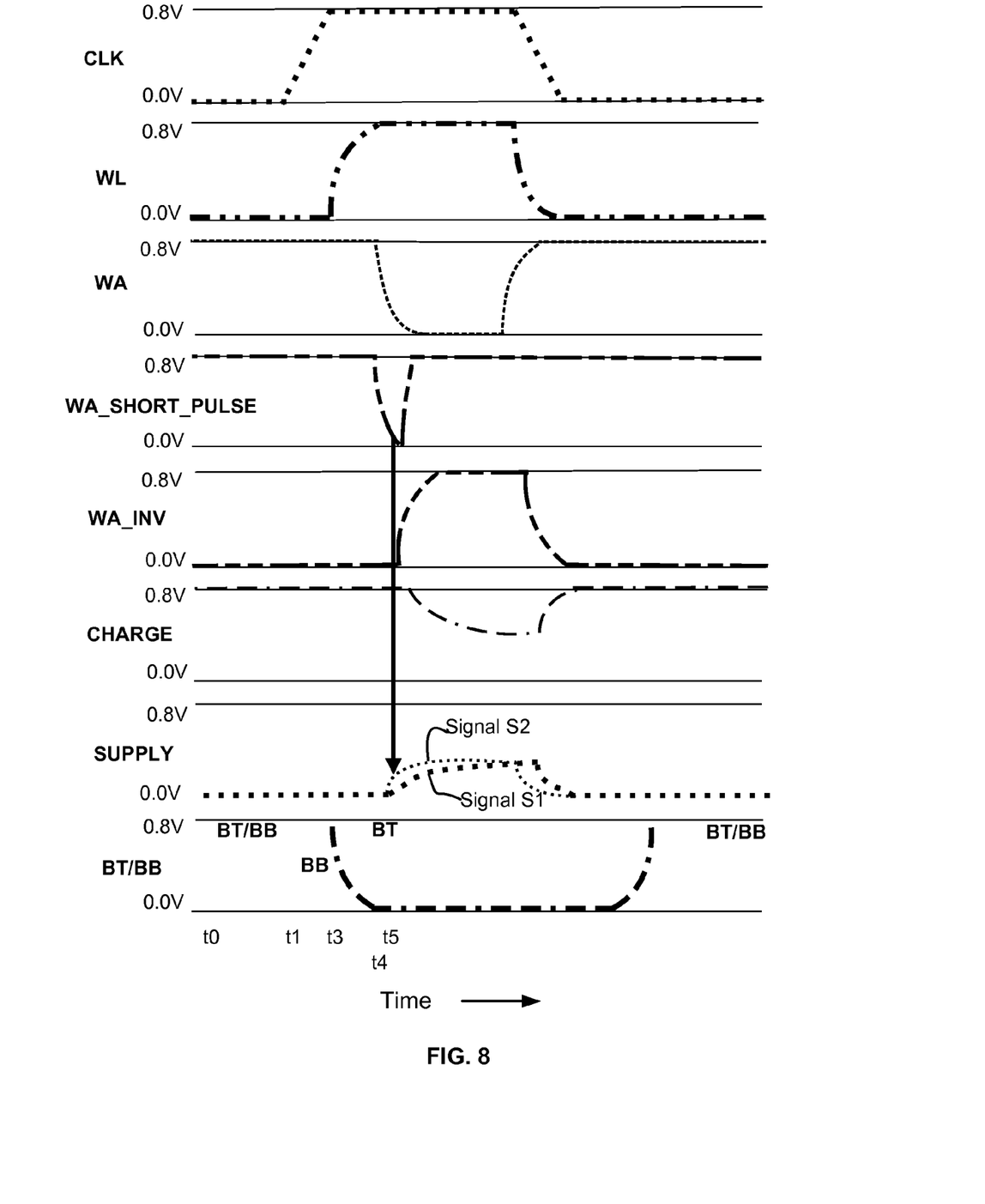
FIG. 8 is a timing diagram illustrating the signals at various nodes of the circuit of FIG. 7, according to an embodiment.

FIG. 8 is a timing diagram illustrating the signals at various nodes of the circuit of FIG. 7, according to an embodiment. In addition to the signals shown in FIG. 4, FIG. 8 shows the WA_SHORT_PULSE signal. The time points t0, t1, t3, and t5 correspond to the corresponding time points shown in FIG. 2. The WA_SHORT_PULSE decreases from a high value to a low value at time t4 that is after the word line enable signal WL. In an embodiment, the time t4 at which WA_SHORT_PULSE decreases from a high value to a low value is substantially close to the time point t5 at which the write assist signal WA decreases from a high value to a low value. The WA_SHORT_PULSE signal stays low for a shorter time interval compared to the WA pulse signal. The WA_SHORT_PULSE signal increases the rate at which the SUPPLY signal at the supply terminal 220 increases. The SUPPLY signal responsive to the WA_SHORT_PULSE is shown as signal S2. In comparison, the SUPPLY signal based on the circuit of FIG. 2 without the WA_SHORT_PULSE is shown as signal 51.

Figure 9:
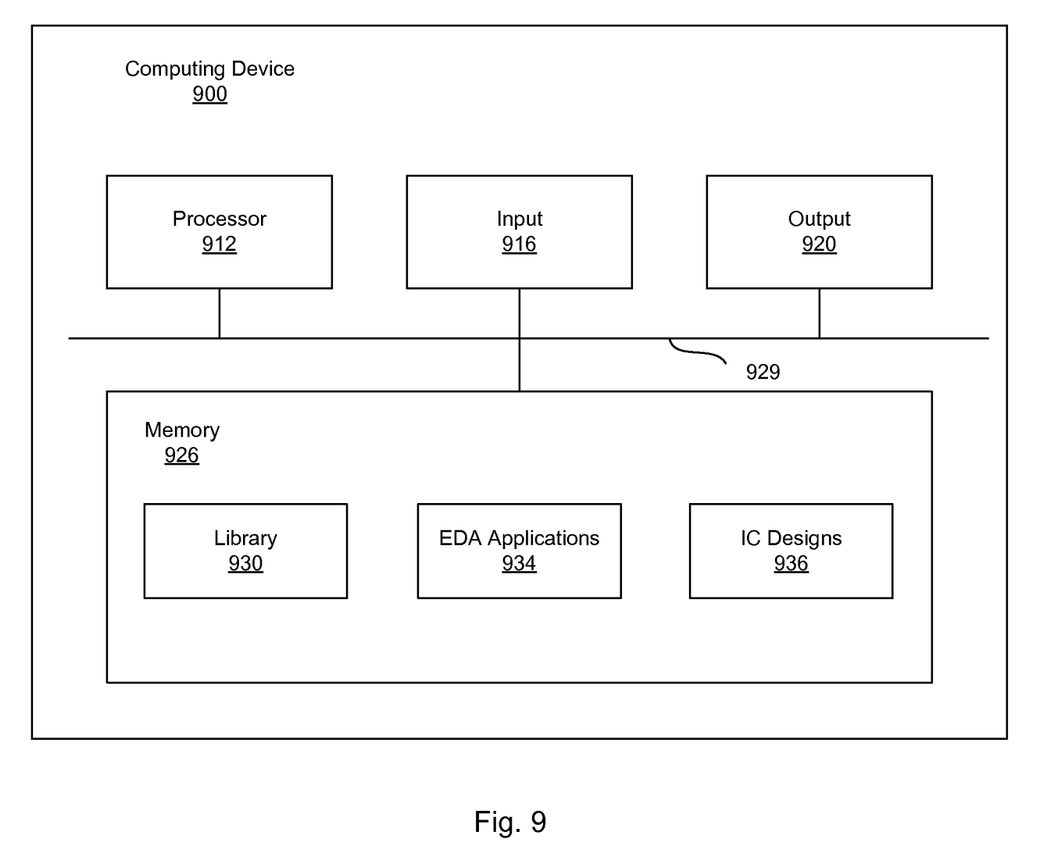
FIG. 9 is a block diagram of a computing device for performing designing operations associated with an integrated circuit, for example, to generate a circuit design for integrated circuit for the transient voltage collapse circuit as described herein.

FIG. 9 is a block diagram of a computing device 900 for performing designing operations associated with an integrated circuit, for example, to generate a circuit design for integrated circuit for the transient voltage collapse circuit and the SRAM circuit as described herein. The computer device 900 may include, among other components, a processor 912, an input module 916, an output module 920, a memory 926 and a bus for connecting these components. The processor 912 executes instructions stored in the memory 926. The input module 916 may include various devices for receiving user input, including keyboards and pointing devices (e.g., mouse and touch screen). The output module 920 includes a display device or interface device for communicating with the display device.

The memory 926 is a non-transitory computer readable storage medium storing, among others, library 930, electronic design automation (EDA) applications 934 and integrated circuit (IC) designs 936. The library 930 may include data on various circuit components, including instances of write assist circuits describe herein. The EDA applications 934 may include various software programs for designing ICs, including place and route tools, synthesis tools, and verification tools. The design processed by the EDA applications 934 may be stored in IC designs 936. The IC designs 936 may be an entire operational circuit or a part of a larger IC circuit.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A circuit for operating a static random access memory (SRAM), comprising:
    a bias transistor having a first terminal, a second terminal, and an input terminal, the first terminal of the bias transistor connected to a voltage supply line of SRAM cells, the second terminal of the bias transistor connected to a first reference voltage lower than a second reference voltage of the SRAM cells, the first terminal of the bias transistor further connected to the first reference voltage via one or more footer transistors, and the input terminal of the bias transistor receiving:
        a power save signal during a power save operation of the SRAM cells, the power save signal configuring the bias transistor to maintain the voltage supply line at a second voltage level higher than the first voltage level,
        a first input signal that configures the bias transistor to connect the voltage supply line to the first reference voltage to maintain the voltage of the supply line at a first voltage level, and
        a write assist pulse during a write operation of the SRAM cells that turns off the bias transistor and the one or more footer transistors to disconnect the voltage supply line from the first reference voltage, and
    a write assist circuit having an input terminal and an output terminal, the input terminal of the write assist circuit connected to the input terminal of the bias transistor to receive the write assist pulse, the output terminal of the write assist circuit connected to the voltage supply line of the SRAM cells, the write assist circuit configured to increase a voltage of the voltage supply line to a third voltage level higher than the first voltage level responsive to receiving the write assist pulse during the write operation.

2. The circuit of claim 1, wherein the write assist circuit comprises:

a capacitive device comprising a first terminal and a second terminal, the first terminal of the capacitive device connected to the first reference voltage; and an access transistor comprising a first terminal, a second terminal, and an input terminal, the input terminal of the access transistor receiving the write assist pulse, the first terminal of the access transistor connected to the voltage supply line, the second terminal of the access transistor connected to the second terminal of the capacitive device, the access transistor turned on while the write assist pulse is active to cause a charge stored in the capacitive device to increase the voltage of the voltage supply line to the third voltage level during the write operation of the SRAM cells.

3. The circuit of claim 2, wherein the write assist circuit further comprises:

an inverter having an input terminal and an output terminal, the input terminal of the inverter connected to the input terminal of the bias transistor to receive the write assist pulse, the inverter generating an inverted write assist pulse at the output terminal of the inverter responsive to receiving the write assist pulse at the input terminal of the inverter; and a precharger transistor comprising a first terminal, a second terminal and an input terminal, the input terminal of the precharger transistor connected to the output terminal of the inverter to receive the inverted write assist pulse, the first terminal of the precharger transistor connected to the second reference voltage, the second terminal of the precharger transistor connected to the second terminal of the capacitive device for charging the capacitive device when the inverted write assist pulse is inactive, the precharger transistor configured to stop charging the capacitive device responsive to receiving the inverted write assist pulse at the input terminal of the precharger transistor.

4. The circuit of claim 1, wherein the write assist pulse is a first write assist pulse, further comprising:

a pull-up transistor comprising a first terminal, a second terminal, and an input terminal, the first terminal of the pull-up transistor connected to the voltage supply line, the second terminal of the pull-up transistor connected to the second reference voltage, the input terminal of the pull-up transistor receiving a short write assist pulse having a duration shorter than the write assist pulse, the short write assist pulse received during the write operation of the SRAM cells, the short write assist pulse causing the pull-up transistor to increase a rate at which voltage of the voltage supply line of the SRAM cells increases responsive to the write assist pulse.

5. The circuit of claim 1, wherein a plurality of SRAM cells receives a word line enable signal having an edge causing the plurality of SRAM cells to be enabled for the write operation, wherein the write assist pulse is received responsive to the edge of the word line enable signal.

6. The circuit of claim 1, wherein the third voltage level is lower than the second reference voltage.

7. The circuit of claim 1, wherein the write assist pulse is active for a duration less than a duration that the input voltage level keeps the bias transistor on to maintain the voltage supply line at the first voltage level.

8. A method for providing a low voltage supply for a static random access memory (SRAM), comprising:

receiving, by a bias transistor, a first input signal at an input terminal of the bias transistor, wherein a first terminal of the bias transistor is connected to a voltage supply line of SRAM cells and a second terminal of the bias transistor is connected to a first reference voltage lower than a second reference voltage of the SRAM cells, the first input signal configuring the bias transistor to maintain the voltage supply line at a first voltage level;

receiving, by the bias transistor, a power save signal during a power save operation of the SRAM cells, the power save signal configuring the bias transistor to maintain the voltage supply line at a second voltage level higher than the first voltage level, receiving, by the bias transistor, a write assist pulse during a write operation of the SRAM cells, the write assist pulse turning off the bias transistor to disconnect the voltage supply line from the first reference voltage;

receiving, by an input terminal of a write assist circuit, the write assist pulse during the write operation of the SRAM cells;

responsive to the write assist pulse, increasing the voltage of the voltage supply line of the SRAM cells by the write assist circuit to a third voltage level higher than the first voltage level; and providing the increased voltage of the voltage supply line to the SRAM cells during the write operation of the SRAM cells.

9. The method of claim 8, further comprising:

charging a capacitive device to store a charge;

turning on an access transistor responsive to receiving the write assist pulse by the access transistor; and causing the charge of the capacitive device to increase the voltage of the supply voltage line to the second voltage level during the write operation of the SRAM cells responsive to receiving the write assist pulse.

10. The method of claim 9, wherein charging the capacitive device is caused by a precharger transistor, the precharger transistor connecting the capacitive device to the second reference voltage, the method further comprising:

receiving, at an input terminal of an inverter, the write assist pulse;

responsive to receiving the write assist pulse, generating at an output terminal of the inverter, an inverted write assist pulse; and receiving, by the precharger transistor, the inverted write assist pulse causing the precharger transistor to stop charging the capacitive device responsive to receiving the inverted write assist pulse at an input terminal of the precharger transistor.

11. The method of claim 8, the method further comprising:

receiving, by a pull-up transistor, a short write assist pulse during the write operation of the SRAM cells, the short write assist pulse having a duration shorter than the write assist pulse, the short write assist pulse causing the pull-up transistor to increase a rate at which voltage of the voltage supply line of the SRAM cells increases responsive to the write assist pulse.

12. The method of claim 8, further comprising:

receiving, by the SRAM cells, a word line enable signal having an edge causing the SRAM cells to be enabled for the write operation, wherein the write assist pulse is received responsive to the edge of the word line enable signal.

13. The method of claim 8, wherein the third voltage level is lower than the second reference voltage.

14. The method of claim 8, wherein the write assist pulse is active for a duration less than a duration that the first input signal is received.

15. A non-transitory computer readable storage medium storing a digital representation of a circuit, the circuit comprising:
- a bias transistor having a first terminal, a second terminal, and an input terminal, the first terminal of the bias transistor connected to a voltage supply line of SRAM cells, the second terminal of the bias transistor connected to a first reference voltage lower than a second reference voltage of the SRAM cells, and the input terminal of the bias transistor receiving:
  - a power save signal during a power save operation of the SRAM cells, the power save signal turning on the bias transistor to maintain the voltage supply line at a second voltage level higher than the first voltage level,
  - a first input signal that configures the bias transistor to connect the voltage supply line to the first reference voltage, thereby maintaining the voltage of the supply line at a first voltage level, and
  - a write assist pulse during a write operation of the SRAM cells that turns off the bias transistor to disconnect the voltage supply line from the first reference voltage; and
- a write assist circuit having an input terminal and an output terminal, the input terminal of the write assist circuit connected to the input terminal of the bias transistor to receive the write assist pulse, the output terminal of the write assist circuit connected to the voltage supply line of the SRAM cells, the write assist circuit configured to increase a voltage of the voltage supply line to a third voltage level higher than the first voltage level responsive to receiving the write assist pulse during the write operation.

16. The non-transitory computer readable storage medium of claim 15, wherein the digital representation of a circuit further comprises:
- a capacitive device comprising a first terminal and a second terminal, the first terminal of the capacitive device connected to the first reference voltage; and
- an access transistor comprising a first terminal, a second terminal, and an input terminal, the input terminal of the access transistor receiving the write assist pulse, the first terminal of the access transistor connected to the voltage supply line, the second terminal of the access transistor connected to the second terminal of the capacitive device, the access transistor turned on while the write assist pulse is active to cause a charge stored in the capacitive device to increase the voltage of the voltage supply line to the third voltage level during the write operation of the SRAM cells.

17. The non-transitory computer readable storage medium of claim 16, wherein the digital representation of a circuit further comprises:
- an inverter having an input terminal and an output terminal, the input terminal of the inverter connected to the input terminal of the bias transistor to receive the write assist pulse, the inverter generating an inverted write assist pulse at the output terminal of the inverter responsive to receiving the write assist pulse at the input terminal of the inverter; and
- a precharger transistor comprising a first terminal, a second terminal and an input terminal, the input terminal of the precharger transistor connected to the output terminal of the inverter to receive the inverted write assist pulse, the first terminal of the precharger transistor connected to the second reference voltage, the second terminal of the precharger transistor connected to the second terminal of the capacitive device for charging the capacitive device when the inverted write assist pulse is inactive, the precharger transistor configured to stop charging the capacitive device responsive to receiving the inverted write assist pulse at the input terminal of the precharger transistor.

18. The non-transitory computer readable storage medium of claim 15, wherein the write assist pulse is a first write assist pulse, wherein the digital representation of a circuit further comprises:
- a pull-up transistor comprising a first terminal, a second terminal, and an input terminal, the first terminal of the pull-up transistor connected to the voltage supply line, the second terminal of the pull-up transistor connected to the second reference voltage, the input terminal of the pull-up transistor receiving a short write assist pulse having a duration shorter than the write assist pulse, the short write assist pulse received during the write operation of the SRAM cells, the short write assist pulse causing the pull-up transistor to increase a rate at which voltage of the voltage supply line of the SRAM cells increases responsive to the write assist pulse.

19. The non-transitory computer readable storage medium of claim 15, wherein the third voltage level is lower than the second reference voltage.

20. The non-transitory computer readable storage medium of claim 15, wherein the write assist pulse is active for a duration less than a duration that the input voltage level keeps the bias transistor on to maintain the voltage supply line at the first voltage level.

* * * * *